United States Patent
Sano et al.

(10) Patent No.: US 12,471,212 B2
(45) Date of Patent: Nov. 11, 2025

(54) STRETCHABLE DEVICE

(71) Applicant: Magnolia White Corporation, Tokyo (JP)

(72) Inventors: Takumi Sano, Tokyo (JP); Masatomo Hishinuma, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 246 days.

(21) Appl. No.: 18/496,954

(22) Filed: Oct. 30, 2023

(65) Prior Publication Data

US 2024/0147611 A1     May 2, 2024

(30) Foreign Application Priority Data

Oct. 31, 2022    (JP) .................................. 2022-174607

(51) Int. Cl.
    H05K 1/02     (2006.01)
(52) U.S. Cl.
    CPC . H05K 1/0283 (2013.01); *H05K 2201/09263* (2013.01)
(58) Field of Classification Search
    CPC ................... H05K 1/0283; H05K 2201/09263
    See application file for complete search history.

(56) References Cited

U.S. PATENT DOCUMENTS

2021/0234108 A1    7/2021   Sano
2023/0384832 A1* 11/2023   Koo ..................... H05K 1/0283

FOREIGN PATENT DOCUMENTS

JP      2021-118273 A     8/2021

* cited by examiner

*Primary Examiner* — Jeremy C Norris
(74) *Attorney, Agent, or Firm* — XSENSUS LLP

(57) ABSTRACT

According to an aspect, a stretchable device includes: a resin base member including a plurality of island-shaped portions spaced apart from each other and a plurality of strip portions that couple the island-shaped portions; and a plurality of first gauge lines and at least one second gauge line having a gauge factor higher than that of the first gauge lines, the first gauge lines and the second gauge line being provided to each of the strip portions. The strip portion of the resin base member has a plurality of curved portions and a linear portion that couples the curved portions. The first gauge lines and the second gauge line each extend along an extending direction of the strip portion and are coupled along the extending direction of the strip portion. The first gauge lines are provided to the curved portions. The second gauge line is provided to the linear portion.

8 Claims, 13 Drawing Sheets

STRETCHABLE DEVICE

CROSS-REFERENCE TO RELATED APPLICATION

This application claims the benefit of priority from Japanese Patent Application No. 2022-174607 filed on Oct. 31, 2022, the entire contents of which are incorporated herein by reference.

BACKGROUND

1. Technical Field

What is disclosed herein relates to a stretchable device.

2. Description of the Related Art

Japanese Patent Application Laid-open Publication No. 2021-118273 (JP-A-2021-118273) discloses a stretchable device (referred to as a flexible substrate in JP-A-2021-118273) including an insulating base member having island-shaped portions and strip portions integrally formed with the island-shaped portions, an organic insulating layer, and electric elements provided on the organic insulating layer and overlapping the island-shaped portions. As described in JP-A-2021-118273, the strip portion has a meandering shape. When a tensile load acts on the stretchable device, for example, the strip portions stretch.

It has been considered to provide a gauge line to the strip portion of the stretchable device and detect the amount of strain in the strip portion. Such a stretchable device is required to improve the sensitivity in detecting the amount of strain.

SUMMARY

According to an aspect, a stretchable device includes: a resin base member including a plurality of island-shaped portions spaced apart from each other and a plurality of strip portions that couple the island-shaped portions; and a plurality of first gauge lines and at least one second gauge line having a gauge factor higher than a gauge factor of the first gauge lines, the first gauge lines and the second gauge line being provided to each of the strip portions. The strip portion of the resin base member has a plurality of curved portions and a linear portion that couples the curved portions. The first gauge lines and the second gauge line each extend along an extending direction of the strip portion and are coupled along the extending direction of the strip portion. The first gauge lines are provided to the curved portions. The second gauge line is provided to the linear portion.

DETAILED DESCRIPTION

Figure 1:
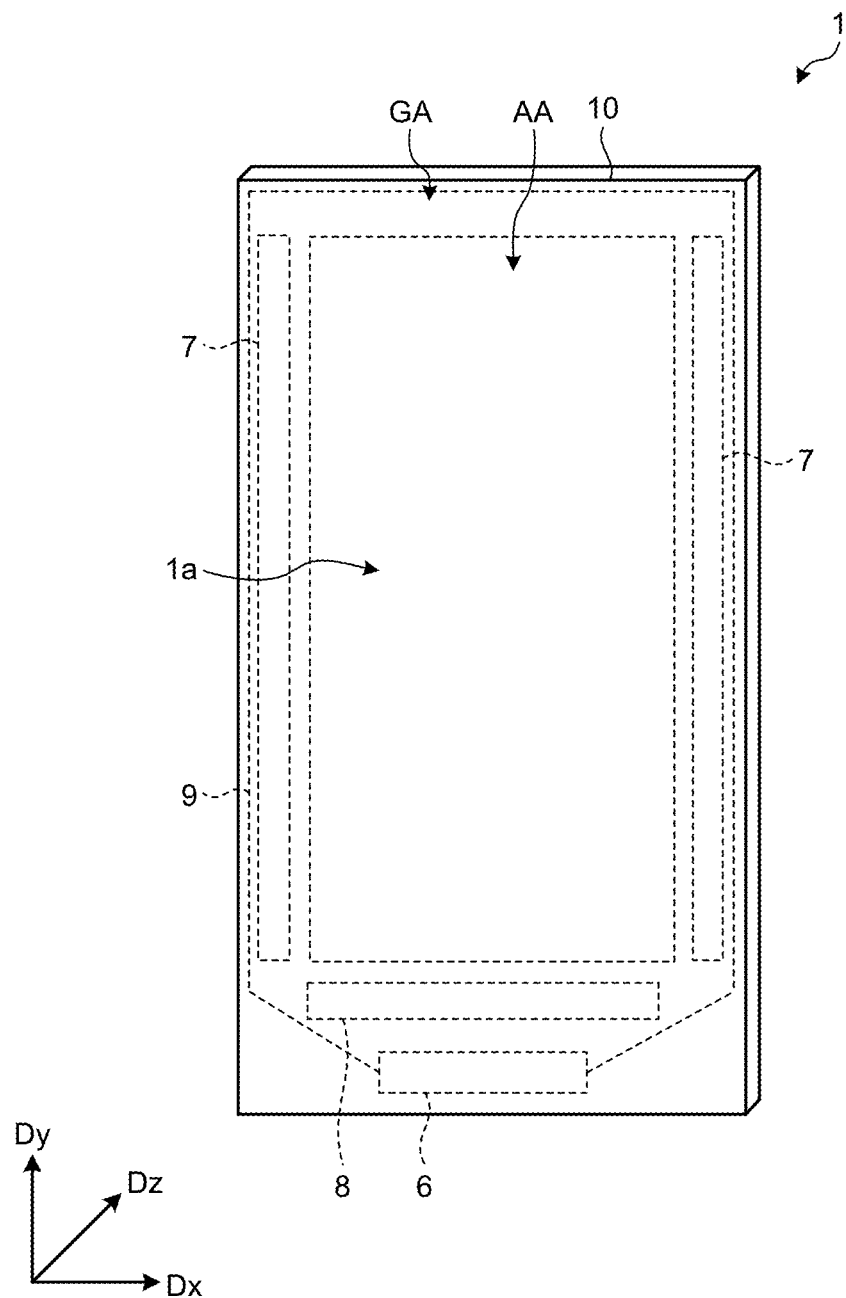
FIG. 1 is a perspective view schematically illustrating a stretchable device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present disclosure and the drawings, components similar to those previously described with reference to previous drawings are denoted by the same reference numerals, and detailed explanation thereof may be appropriately omitted.

When the term "on" is used to describe an aspect where a first structure is disposed on a second structure in the present specification and the claims, it includes both of the following cases unless otherwise noted: a case where the first structure is disposed on and in contact with the second structure, and a case where the first structure is disposed above the second structure with still another structure interposed therebetween.

First Embodiment

FIG. 1 is a perspective view schematically illustrating a stretchable device according to a first embodiment. As illustrated in FIG. 1, a stretchable device 1 includes a resin base member 10, a coupler 6, a gate line drive circuit 7, a signal line selection circuit 8, and reference potential supply wiring 9.

In the following description, a first direction Dx is a direction in a plane parallel to the resin base member 10. A second direction Dy is a direction in the plane parallel to the resin base member 10 and is orthogonal to the first direction Dx. The second direction Dy may intersect the first direction Dx without being orthogonal thereto. A third direction Dz is a direction orthogonal to the first direction Dx and the second direction Dy and is the normal direction of the main surface of the resin base member 10. The term "plan view" refers to the positional relation when viewed from a direction perpendicular to the resin base member 10. The resin base member 10 of the stretchable device 1 is made of elastic and flexible material and can be deformed. The first direction Dx, the second direction Dy, and the third direction Dz indicate the directions when the resin base member 10 is placed flat.

The stretchable device 1 is formed using the resin base member 10 as a substrate. The stretchable device 1 has a detection region AA and a peripheral region GA. The detection region AA is a region where the amount of strain of the stretchable device 1 can be detected. Specifically, the detection region AA is a region provided with a plurality of gauge lines 35 (refer to FIG. 2) and a plurality of transistors Tr (refer to FIG. 2). The peripheral region GA is a region between the outer periphery of the detection region AA and the outer end of the resin base member 10 and is not provided with the gauge lines 35. The coupler 6, the gate line drive circuit 7, the signal line selection circuit 8, and the reference potential supply wiring 9 are provided in the peripheral region GA.

The coupler 6 is electrically coupled to a drive integrated circuit (IC) disposed outside the stretchable device 1. The drive IC may be mounted on a wiring substrate (e.g., a flexible printed circuit board or a rigid board), which is not illustrated, coupled to the coupler 6. Alternatively, the drive IC may be mounted on the peripheral region GA of a first resin layer 60 (refer to FIG. 3).

The gate line drive circuit 7 is a circuit that drives a plurality of gate lines GL (refer to FIG. 2) based on various control signals supplied from the drive IC. The gate line drive circuit 7 sequentially or simultaneously selects the gate lines GL and supplies gate drive signals to the selected gate line GL. The signal line selection circuit 8 is a switch circuit that sequentially or simultaneously selects a plurality of signal lines SL (refer to FIG. 2). The signal line selection circuit 8 is a multiplexer, for example. The signal line selection circuit 8 couples the selected signal line SL to the drive IC based on selection signals supplied from the drive IC.

The reference potential supply wiring 9 is wiring for supplying a reference potential to the stretchable device 1 and extends along the peripheral region GA. The reference potential supply wiring 9 is coupled to the drive IC via the coupler 6.

Figure 2:
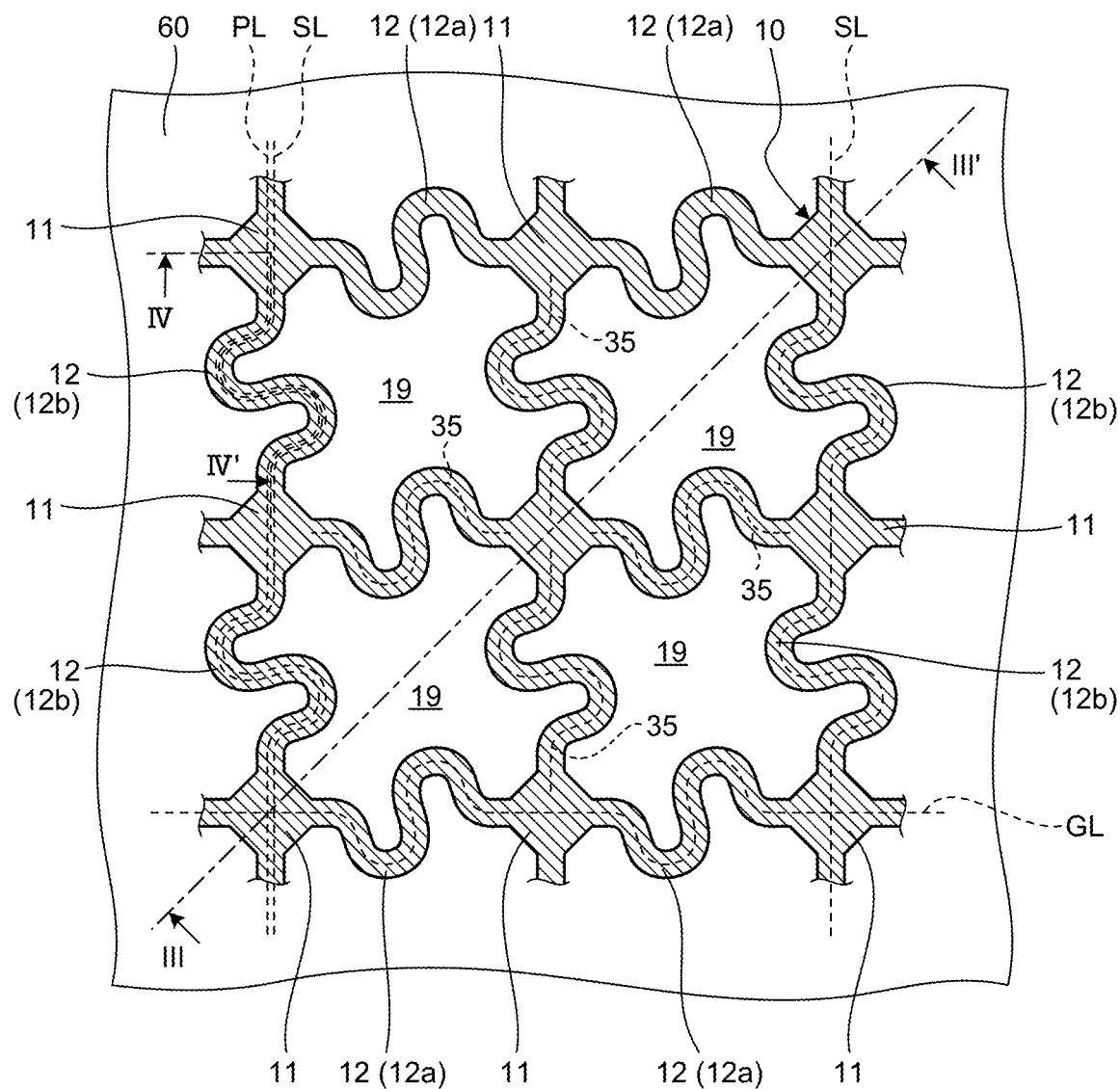
FIG. 2 is a plan view schematically illustrating the stretchable device according to the first embodiment.

FIG. 2 is a plan view schematically illustrating the stretchable device according to the first embodiment. In FIG. 2, the resin base member 10 is hatched to make it easy to refer to the resin base member 10. The resin base member 10 is provided on the upper surface of the first resin layer 60. The resin base member 10 has elastic, flexible, and insulating properties. The resin base member is made of resin material, such as polyimide.

The resin base member 10 includes a plurality of island-shaped portions 11 spaced apart from each other and a plurality of strip portions 12 that couple the island-shaped portions 11. More specifically, the island-shaped portions 11 are arrayed in a matrix (row-column configuration). The island-shaped portions 11 each have a quadrilateral (square) shape in plan view. The island-shaped portions 11 are disposed such that the four corners face the first direction Dx and the second direction Dy. An array layer 30 including the transistor Tr is stacked on the island-shaped portion 11 (refer to FIG. 3). The island-shaped portion 11 does not necessarily have a quadrilateral shape and may have a circular shape or other polygonal shapes.

The strip portions 12 include first strip portions 12a extending in the first direction Dx and second strip portions 12b extending in the second direction Dy. The first strip portion 12a couples the island-shaped portions 11 adjacently disposed in the first direction Dx. The second strip portion 12b couples the island-shaped portions 11 adjacently disposed in the second direction Dy. The first strip portion 12a and the second strip portion 12b each are formed in a meandering shape. The width of each of the first strip portion 12a and the second strip portion 12b (the length in a direction perpendicular to the extending direction of each of the first strip portion 12a and the second strip portion 12b) is smaller than the width of the island-shaped portions 11.

The first strip portions 12a are provided with the gate lines GL and the gauge lines 35. The gate lines GL and the gauge lines 35 are provided along the extending direction of the first strip portions 12a. The second strip portions 12b are provided with the signal lines SL, drive power supply lines PL, and the gauge lines 35. The signal lines SL, the drive power supply lines PL, and the gauge lines 35 are provided along the extending direction of the second strip portions 12b. The gauge line 35 is a strain gauge (strain detecting element) the resistance of which changes corresponding to the amount of strain. The configuration of the gauge line 35 will be described later with reference to FIG. 8 and subsequent figures.

The gate line GL extends across more than one of the island-shaped portions 11 and across more than one of the first strip portions 12a. As a result, the gate line GL continuously extends from one end to the other end of the detection region AA in the first direction Dx. One end of the gate line GL is coupled to the gate line drive circuit 7 (refer to FIG. 1).

The signal line SL and the drive power supply line PL extend across more than one of the island-shaped portions 11 and across more than one of the second strip portions 12b. As a result, the signal line SL and the drive power supply line PL continuously extend from one end to the other end of the detection region AA in the second direction Dy. The signal line SL and the drive power supply line PL are electrically coupled to the drive IC.

In the following description, the first strip portion 12a and the second strip portion 12b are simply referred to as strip portions 12 when they need not be distinguished from each other. To simplify the drawing, FIG. 2 illustrates part of the gate lines GL, the signal line SL, the drive power supply lines PL, and the gauge line 35. The gate line GL and the gauge line 35 are provided to the strip portions 12 (first strip portions 12a) of each row, and the signal line SL, the drive power supply line PL, and the gauge line 35 are provided to the strip portions 12 (second strip portions 12b) of each column. The configuration of the strip portion 12 will be described later in greater detail with reference to FIG. 6 and subsequent figures.

An opening 19 passing through the resin base member 10 in the third direction Dz is formed in the area surrounded by the island-shaped portions 11 and the strip portions 12. The resin base member 10 has a plurality of the openings 19.

Figure 3:
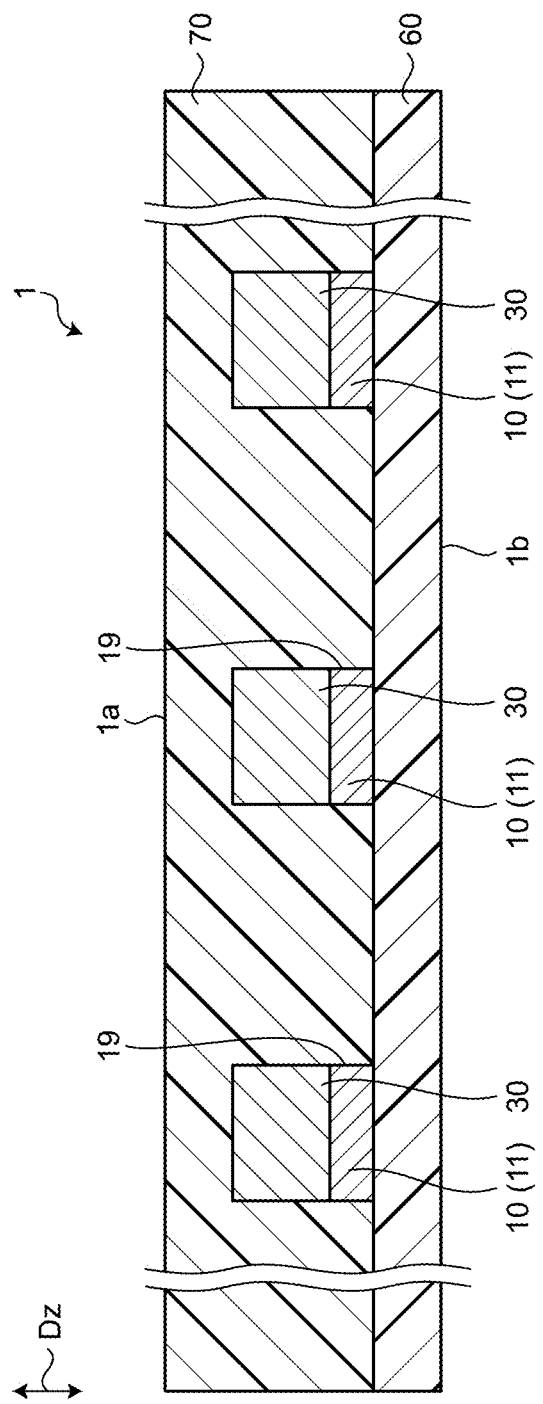
FIG. 3 is a sectional view along line III-III' of FIG. 2.

FIG. 3 is a sectional view along line III-III' of FIG. 2. As illustrated in FIG. 3, the stretchable device 1 includes the first resin layer 60 having a back surface 1b, a second resin layer 70 having a front surface 1a, and the resin base member 10 and the array layer 30 sandwiched between the first resin layer 60 and the second resin layer 70. The resin base member 10 and the array layer 30 are stacked in this order on the surface opposite to the back surface 1b of the first resin layer 60. The array layer 30 includes various components for detecting the amount of strain in the strip portion 12. The array layer 30 is provided with various circuits, such as the transistors Tr, and various kinds of wiring, such as the gauge lines 35, the gate lines GL, the signal lines SL, and the drive power supply lines PL.

The first resin layer 60 and the second resin layer 70 are made of resin material and have elasticity and flexibility. While examples of the resin material include, but are not limited to, acrylic resin, epoxy resin, urethane resin, etc., the present disclosure is not limited thereto. In the following description, the upper side or upward refers to one side in the third direction Dz and the side in which the second resin layer 70 is disposed with respect to the first resin layer 60. The lower side or downward refers to the other side in the third direction Dz and the side in which the first resin layer 60 is disposed with respect to the second resin layer 70.

The array layer 30 is not stacked on the area overlapping the opening 19 of the resin base member 10. The opening 19 is filled with the second resin layer 70. With this configuration, the stretchable device 1 has low rigidity in the area overlapping the opening 19 and has elasticity and bendability (stretchability). When a load acts on the stretchable device 1, the strip portions 12 overlapping the openings 19 in the first direction Dx or the second direction Dy are deformed. This mechanism reduces the amount of deformation in the island-shaped portions 11 and suppresses damage to functional elements (transistors Tr according to the present embodiment) stacked on the island-shaped portions 11. While the opening 19 according to the present embodiment is filled with the second resin layer 70, it may be filled with the first resin layer 60 or the first resin layer 60 and the second resin layer 70.

Figure 4:
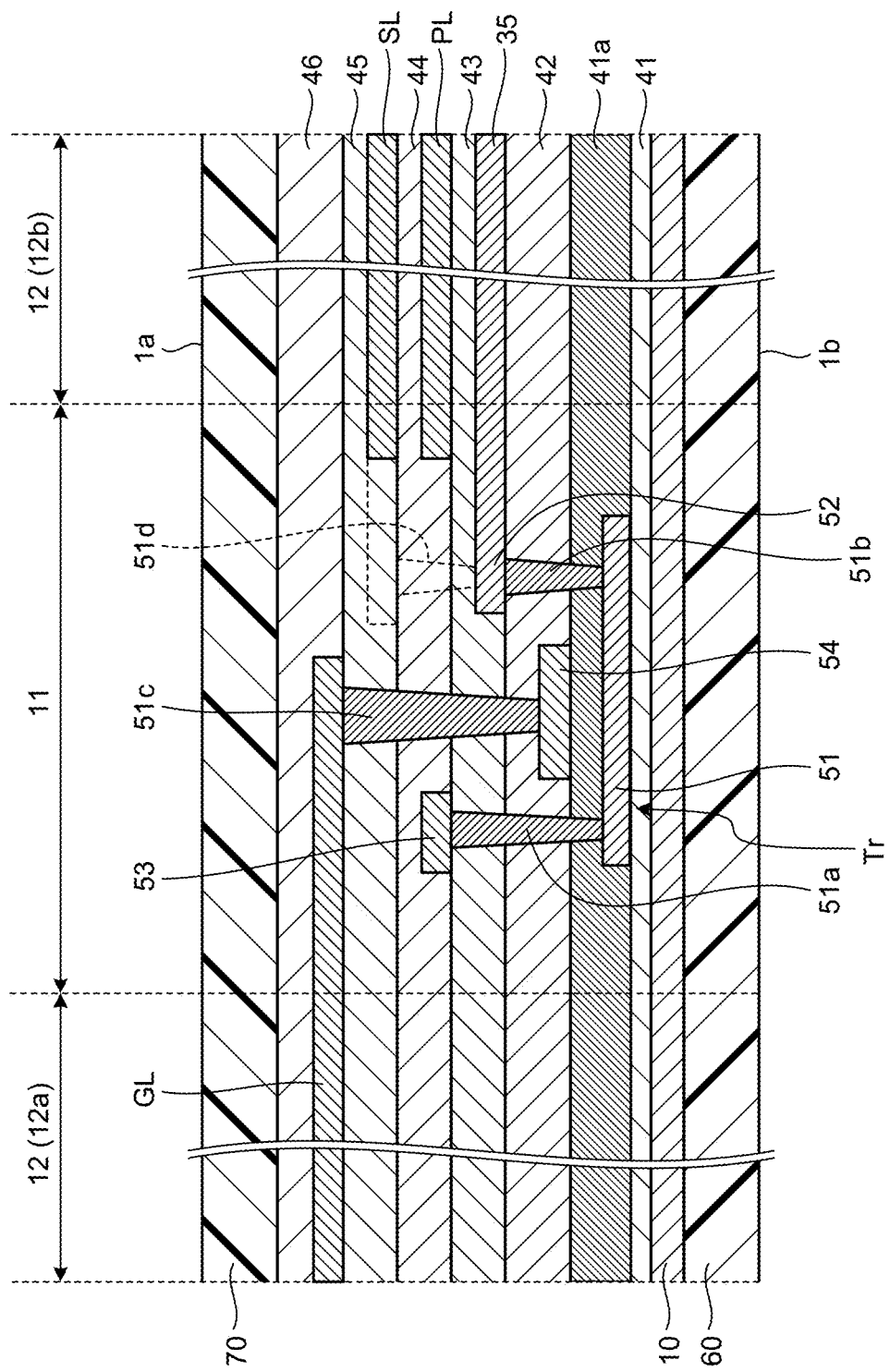
FIG. 4 is a sectional view along line IV-IV' of FIG. 2.

FIG. 4 is a sectional view along line IV-IV' of FIG. 2. As illustrated in FIG. 4, an insulating layer 41, an insulating layer 41a, an insulating layer 42, an insulating layer 43, an insulating layer 44, an insulating layer 45, and an insulating layer 46 are stacked in this order on the resin base member 10. The insulating layer 41, the insulating layer 41a, the insulating layer 42, the insulating layer 43, the insulating layer 44, the insulating layer 45, and the insulating layer 46 are silicon oxide films, for example, and cover the transistor Tr and various kinds of wiring (the gate line GL, the signal line SL, the drive power supply line PL, and the gauge line 35).

The transistor Tr is provided to the island-shaped portion 11 of the resin base member 10. The transistor Tr includes a semiconductor layer 51, a source electrode 52, a drain electrode 53, and a gate electrode 54. The semiconductor layer 51 is provided on the insulating layer 41. The insulating layer 41a is provided on the insulating layer 41 to cover the semiconductor layer 51.

The gate electrode 54 is provided on the insulating layer 41a. The insulating layer 42 is provided on the insulating layer 41a to cover the gate electrode 54. The source electrode 52 is provided on the insulating layer 42 and is coupled to the semiconductor layer 51 via a contact layer 51b. The insulating layer 43 is provided on the insulating layer 42 to cover the source electrode 52. The drain electrode 53 is provided on the insulating layer 43 and is coupled to the semiconductor layer 51 via a contact layer 51a.

The gauge line 35 is provided on the insulating layer 42. The gauge line 35 is stacked across the insulating layer 42 on the island-shaped portion 11 and the insulating layer 42 on the second strip portion 12b and continuously extends in the planar direction (second direction Dy). The gauge line 35 is provided in the same layer as the source electrode 52 of the transistor Tr. One end of the gauge line 35 is electrically coupled to the source electrode 52. The other end of the gauge line 35 is coupled to the signal line SL via a contact layer 51d.

The drive power supply line PL is wiring for supplying a predetermined drive power supply potential to the gauge line 35. As illustrated in FIG. 4, the drive power supply line PL is provided in the same layer as the drain electrode 53 on the insulating layer 43. The drive power supply line PL is stacked across the insulating layer 43 on the island-shaped portion 11 and the insulating layer 43 on the second strip portion 12b and continuously extends in the planar direction (second direction Dy).

The signal line SL is provided on the insulating layer 44. The signal line SL is stacked across the insulating layer 44 on the island-shaped portion 11 and the insulating layer 44 on the second strip portion 12b and continuously extends in the planar direction (second direction Dy). The signal line SL is coupled to the source electrode 52 of the transistor Tr via the contact layer 51d and the gauge line 35.

The gate line GL is provided on the insulating layer 45. The gate line GL is stacked across the insulating layer 45 on the island-shaped portion 11 and the insulating layer 45 on the first strip portion 12a and continuously extends in the planar direction (first direction Dx). The gate line GL is coupled to the gate electrode 54 of the transistor Tr via a contact layer 51c.

Figure 5:
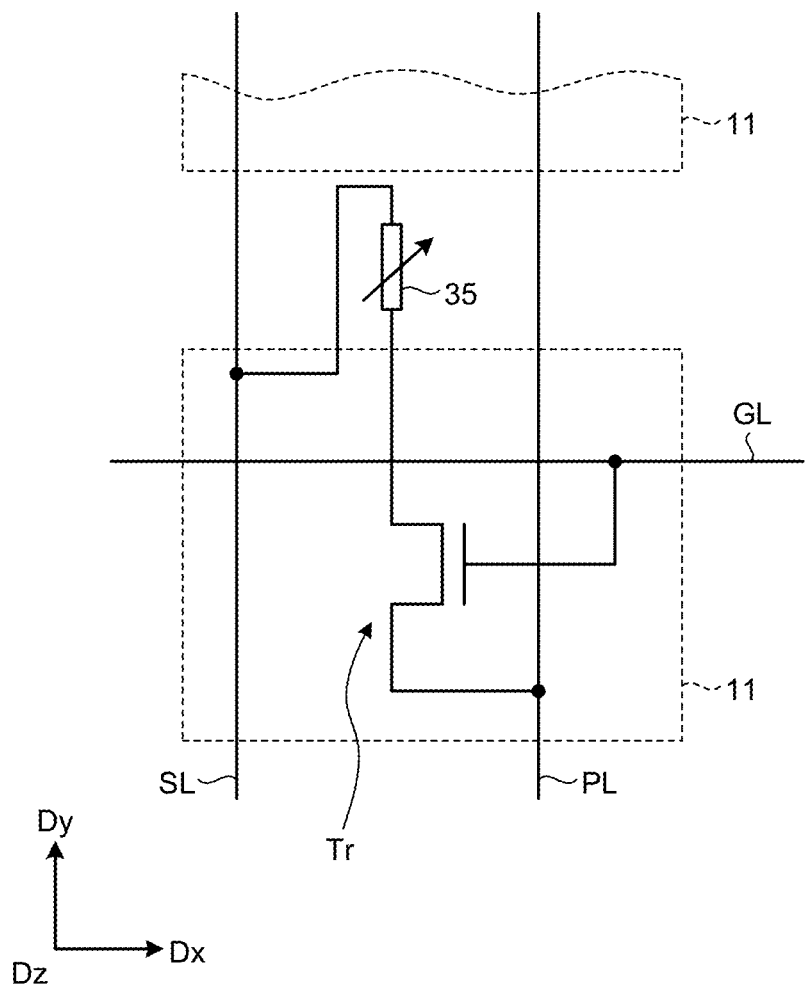
FIG. 5 is a circuit diagram of the stretchable device according to the first embodiment.

FIG. 5 is a circuit diagram of the stretchable device according to the first embodiment. As illustrated in FIG. 5, the gate of the transistor Tr is coupled to the gate line GL. The drain of the transistor Tr is coupled to the drive power supply line PL. The source of the transistor Tr is coupled to the signal line SL via the gauge line 35.

When the gate line GL is scanned by the gate line drive circuit 7, the transistor Tr is turned ON (coupled state). As a result, the drive power supply line PL and the gauge line 35 are electrically coupled, and the drive power supply potential is supplied from the drive power supply line PL to the gauge line 35. A detection signal (electric current) corresponding to the resistance of the gauge line 35 flows to the signal line SL. The detection signal (electric current) of the signal line SL is output to the drive IC.

If the strip portion 12 is deformed (a strain is generated in the gauge line 35), the resistance of the gauge line 35 changes. In other words, the value of the detection signal output from the signal line SL differs between when a strain is generated and when no strain is generated in the gauge line 35. The drive IC detects the amount of strain in the gauge line 35 based on the amount of change in the detection signal from the signal line SL.

Figure 6:
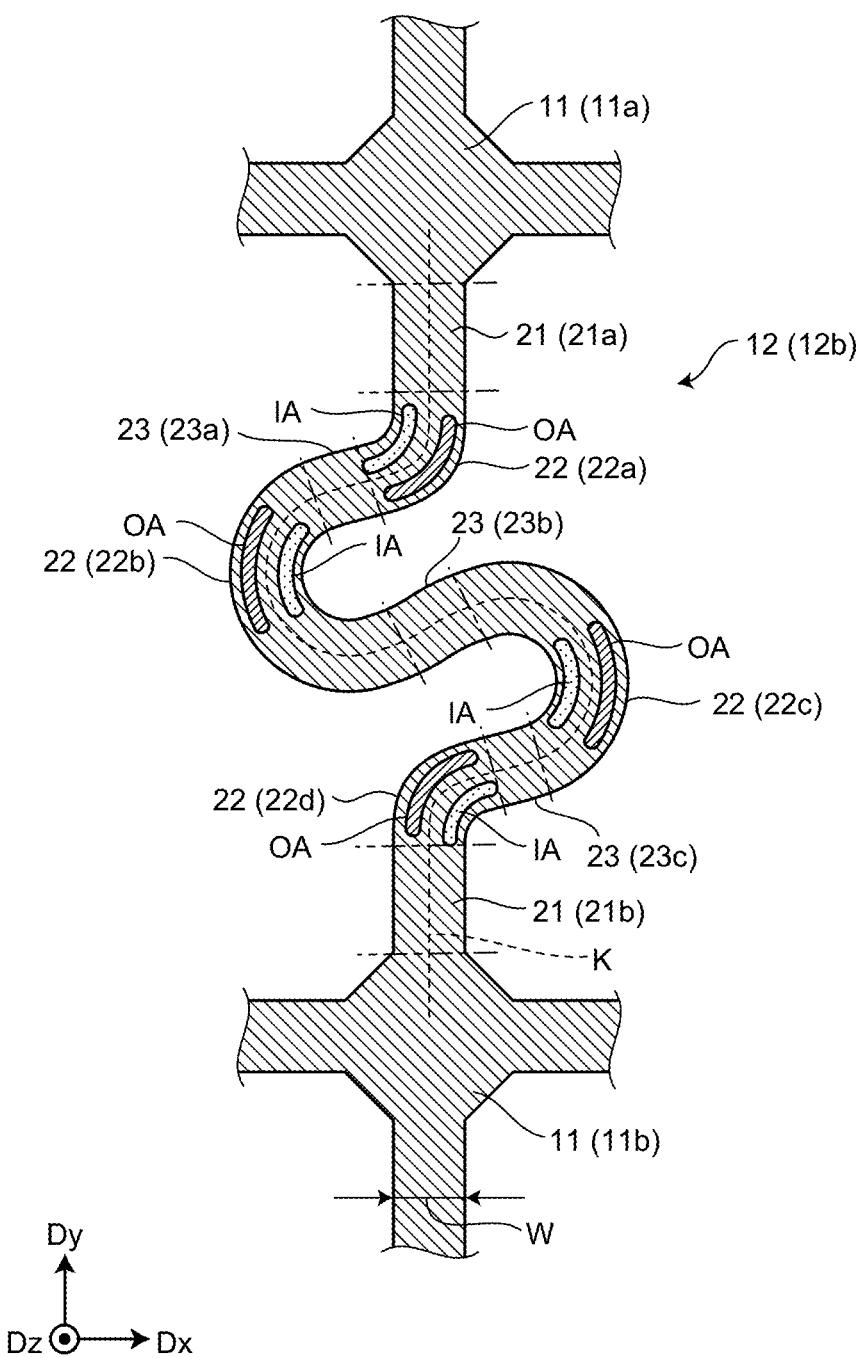
FIG. 6 is an enlarged plan view of island-shaped portions and a strip portion of a resin base member according to the first embodiment.
Figure 7:
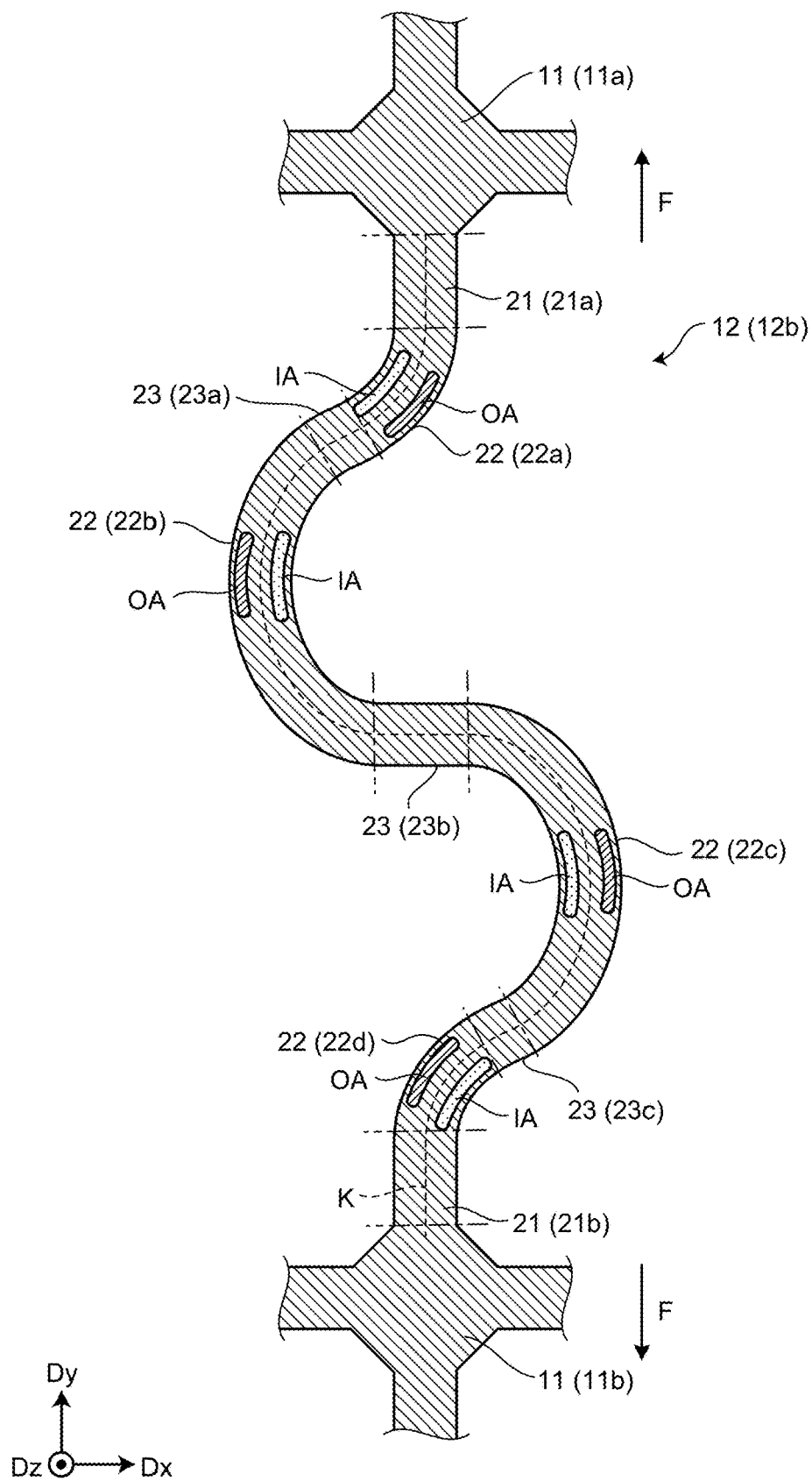
FIG. 7 is an enlarged plan view of the island-shaped portions and the strip portion of the resin base member when the resin base member is deformed in a direction in which the island-shaped portions move away from each other.

Next, the configuration of the strip portion 12 is described. FIG. 6 is an enlarged plan view of the island-shaped portions and the strip portion of the resin base member according to the first embodiment. FIG. 7 is an enlarged plan view of the island-shaped portions and the strip portion of the resin base member when the resin base member is deformed in a direction in which the island-shaped portions move away from each other.

The following describes the second strip portion 12b. The description of the second strip portion 12b is also applicable to the first strip portion 12a because the second strip portion 12b has the same shape as the first strip portion 12a when rotated by 90 degrees.

As illustrated in FIG. 6, a length W of the strip portion 12 in the width direction is constant in the extending direction of the strip portion 12. The strip portion 12 extends in the second direction Dy as a whole while meandering between two island-shaped portions 11.

The strip portion 12 is disposed between a first island-shaped portion 11a and a second island-shaped portion 11b spaced apart in the second direction Dy. The strip portion 12 includes two bases 21, a plurality of curved portions 22 positioned between the two bases 21, and linear portions 23 that couple the curved portions 22. The two bases 21 are each coupled to and linearly extend from the island-shaped portion 11. The curved portions 22 are each curved in an arc shape. The linear portions 23 are portions having a smaller curvature than the curved portions 22 and formed in a substantially linear shape between two curved portions 22.

More specifically, the strip portion 12 is composed of a first base 21a, a first curved portion 22a, a first linear portion 23a, a second curved portion 22b, a second linear portion 23b, a third curved portion 22c, a third linear portion 23c, a fourth curved portion 22d, and a second base 21b coupled in this order from the first island-shaped portion 11a to the second island-shaped portion 11b.

In the following description, the first island-shaped portion 11a and the second island-shaped portion 11b are simply referred to as island-shaped portions 11 when they need not be distinguished from each other. The first base 21a and the second base 21b are simply referred to as bases 21 when they need not be distinguished from each other. The first curved portion 22a, the second curved portion 22b, the third curved portion 22c, and the fourth curved portion 22d are simply referred to as curved portions 22 when they need not be distinguished from one another. The first linear portion 23a, the second linear portion 23b, and the third linear portion 23c are simply referred to as linear portions 23 when they need not be distinguished from one another.

The first base 21a is formed in a linear shape extending in the second direction Dy with one end coupled to the first island-shaped portion 11a and the other end coupled to the first curved portion 22a. The first curved portion 22a has a quadrant shape and is curved at approximately 90 degrees. The first curved portion 22a is curved toward the other side (left side of FIG. 6) in the first direction Dx with respect to the first base 21a. The first linear portion 23a couples the first curved portion 22a to the second curved portion 22b. The second curved portion 22b has a semicircular arc shape and is curved at approximately 180 degrees. The second linear portion 23b couples the second curved portion 22b to the third curved portion 22c.

The third curved portion 22c has a semicircular arc shape and is curved at approximately 180 degrees on the opposite side to the second curved portion 22b. The third linear portion 23c couples the third curved portion 22c to the fourth curved portion 22d. The fourth curved portion 22d has a quadrant shape and is curved at approximately 90 degrees. The fourth curved portion 22d is curved toward one side (right side of FIG. 6) in the first direction Dx with respect to the second base 21b. The first curved portion 22a and the fourth curved portion 22d are curved in opposite directions. The second base 21b is formed in a linear shape extending in the second direction Dy with one end coupled to the fourth curved portion 22d and the other end coupled to the second island-shaped portion 11b.

An imaginary center line K illustrated in FIGS. 6 and 7 is an imaginary line passing through the center in the width direction perpendicular to the extending direction of the strip portion 12. The curved portions 22 are each divided into an inner peripheral portion IA positioned on the inner side (inner peripheral side) and an outer peripheral portion OA positioned on the outer side (outer peripheral side) with respect to the imaginary center line K serving as the boundary. In FIGS. 6 and 7, the inner peripheral portion IA and the outer peripheral portion OA are schematically enclosed by ellipses. In each of the curved portions 22, the entire area on the inner peripheral side with respect to the imaginary center line K is the inner peripheral portion IA, and the entire area on the outer peripheral side with respect to the imaginary center line K is the outer peripheral portion OA. Therefore, the area enclosed by the ellipse is part of the inner peripheral portion IA or the outer peripheral portion OA. The inner peripheral portion IA of the first curved portion 22a and the inner peripheral portion IA of the second curved portion 22b are positioned on the opposite sides with respect to the imaginary center line K at the center in the width direction. The inner peripheral portion IA of the second curved portion 22b and the inner peripheral portion IA of the third curved portion 22c are positioned on the opposite sides with respect to the imaginary center line K at the center in the width direction. The inner peripheral portion IA of the third curved portion 22c and the inner peripheral portion IA of the fourth curved portion 22d are positioned on the opposite sides with respect to the imaginary center line K at the center in the width direction.

When the stretchable device 1 is pulled in the direction of an arrow F (second direction Dy) as illustrated in FIG. 7, for example, the strip portion 12 stretches in the second direction Dy. Specifically, one end and the other end of each curved portion 22 deform to cause the distance therebetween to be longer, and thus the length of the strip portion 12 in the second direction Dy becomes longer. In other words, the distance between the first island-shaped portion 11a and the second island-shaped portion 11b in the second direction Dy becomes longer.

In this case, different stresses act on the inner peripheral portion IA and the outer peripheral portion OA of each curved portion 22. Tensile stress is generated in the inner peripheral portions IA of the first curved portion 22a, the second curved portion 22b, the third curved portion 22c, and the fourth curved portion 22d. Compressive stress is generated in the outer peripheral portions OA of the first curved portion 22a, the second curved portion 22b, the third curved portion 22c, and the fourth curved portion 22d.

Both ends of the first linear portion 23a, the second linear portion 23b, and the third linear portion 23c are coupled to the curved portions 22. As a result, the first linear portion 23a, the second linear portion 23b, and the third linear portion 23c have a smaller amount of strain than the curved portions 22.

As described above, one end of the first base 21a is coupled to the first island-shaped portion 11a, and the other end of the first base 21a is coupled to the first curved portion 22a. One end of the second base 21b is coupled to the fourth curved portion 22d, and the other end of the second base 21b is coupled to the second island-shaped portion 11b. In other words, the first base 21a and the second base 21b are coupled to the island-shaped portions 11 less deformable than the curved portions 22. Therefore, when the strip portion 12 is stretched in the second direction Dy, the first base 21a and the second base 21b have a larger amount of strain than the linear portions 23.

In FIG. 7, a stretching load acts on the stretchable device 1 in the second direction Dy, for example. By contrast, when a compressive load acts on the stretchable device 1 in the second direction Dy, compressive stress is generated in the inner peripheral portion IA of each curved portion 22, and tensile stress is generated in the outer peripheral portion OA of each curved portion 22.

Figure 8:
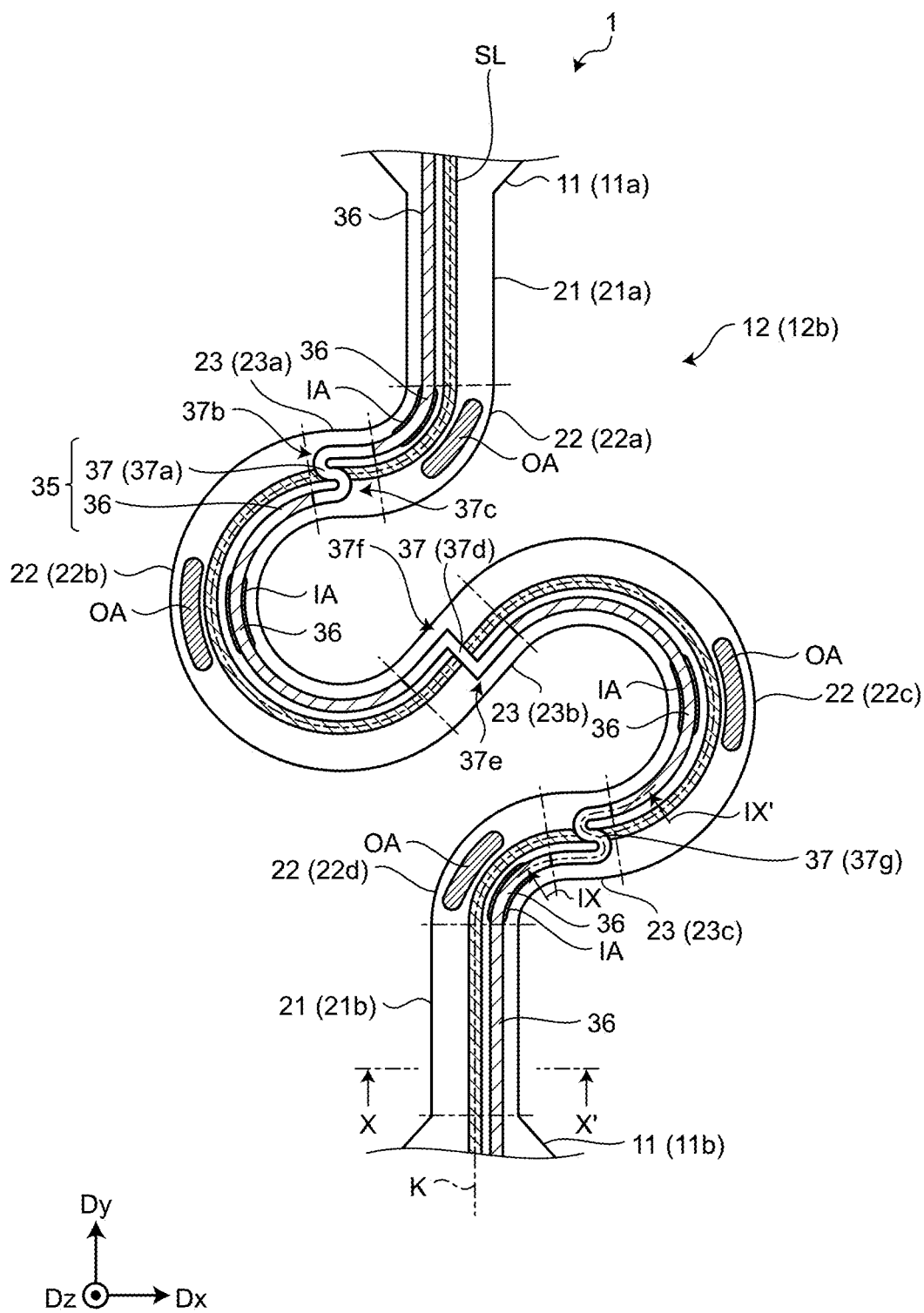
FIG. 8 is a plan view of the configuration of the resin base member, a signal line, and a gauge line according to the first embodiment.

The following describes the configuration of the gauge line 35 in greater detail. FIG. 8 is a plan view of the configuration of the resin base member, the signal line, and the gauge line according to the first embodiment. As illustrated in FIG. 8, the strip portion 12 (second strip portion 12b) is provided with the gauge line 35 and the signal line SL. The signal line SL extends along the extending direction of the strip portion 12 and is provided across a plurality of bases 21, a plurality of curved portions 22, and a plurality of linear portions 23. The signal line SL passes through the center of the strip portion 12 in the width direction. In other words, the signal line SL overlaps the imaginary center line K in plan view.

The gauge line 35 includes a first gauge line 36 and a second gauge line 37. The gauge factor of the second gauge line 37 is higher than that of the first gauge line 36. Specifically, the first gauge line 36 is made of metal material, such as aluminum (Al) and titanium (Ti), or alloy, such as copper-nickel alloy (Cu—Ni). The first gauge factor of the first gauge line 36 made of the metal material or alloy described above is approximately 2.0. The second gauge line 37 is made of semiconductor material, such as polysilicon (p-Si). The second gauge factor of the second gauge line 37 is approximately 100 times the first gauge factor, that is, approximately 200.

The gauge factor is a constant defined by the material used for the gauge line 35 (the first gauge line 36 and the second gauge line 37). When the amount of strain in the gauge line 35 is constant, the amount of change in resistance is proportional to the gauge factor. In other words, the second gauge line 37 has higher detection sensitivity than the first gauge line 36.

The first gauge line 36 and the second gauge line 37 each extend along the extending direction of the strip portion 12 and are coupled along the extending direction of the strip portion 12. In other words, the first gauge line 36 is separated into a plurality of parts at the positions where the second gauge line 37 is provided. The first gauge line 36 and the second gauge line 37 are formed in a meandering shape along the extending direction of the strip portion 12 as a whole.

More specifically, the first gauge line 36 is provided to the first base 21a, the first curved portion 22a, the second curved portion 22b, the third curved portion 22c, the fourth curved portion 22d, and the second base 21b, from the first island-shaped portion 11a to the second island-shaped portion 11b. The first gauge line 36 is continuously provided across the first base 21a and the first curved portion 22a. The first gauge line 36 is continuously provided to each of the second curved portion 22b and the third curved portion 22c. The first gauge line 36 is continuously provided across the fourth curved portion 22d and the second base 21b.

The second gauge line 37 is provided to the first linear portion 23a, the second linear portion 23b, and the third linear portion 23c. In the first linear portion 23a, one end of the second gauge line 37 is coupled to the first gauge line 36 of the first curved portion 22a, and the other end of the second gauge line 37 is coupled to the first gauge line 36 of the second curved portion 22b. In the second linear portion 23b, one end of the second gauge line 37 is coupled to the first gauge line 36 of the second curved portion 22b, and the other end of the second gauge line 37 is coupled to the first gauge line 36 of the third curved portion 22c. In the third linear portion 23c, one end of the second gauge line 37 is coupled to the first gauge line 36 of the third curved portion 22c, and the other end of the second gauge line 37 is coupled to the first gauge line 36 of the fourth curved portion 22d.

Figure 9:
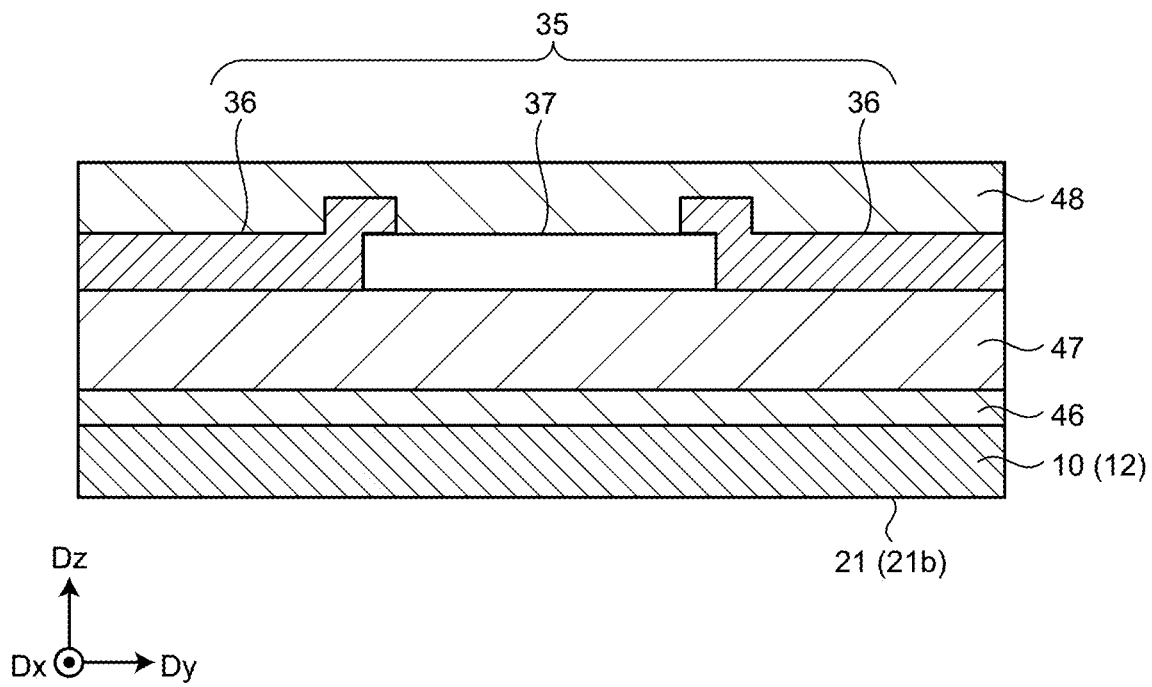
FIG. 9 is a sectional view along line IX-IX' of FIG. 8.
Figure 10:
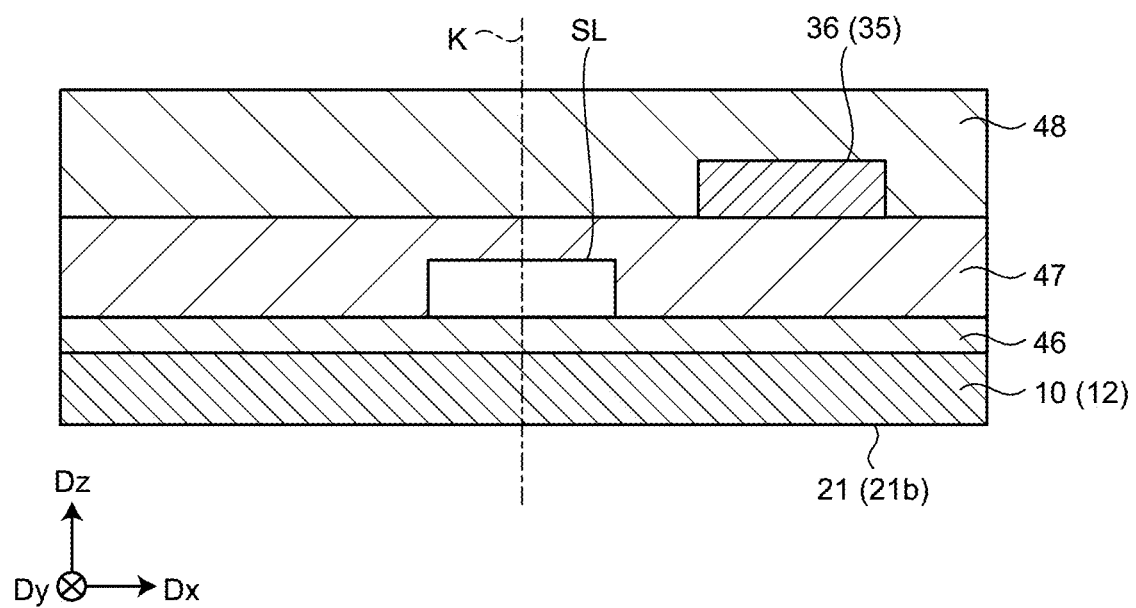
FIG. 10 is a sectional view along line X-X' of FIG. 8.

FIG. 9 is a sectional view along line IX-IX' of FIG. 8. FIG. 10 is a sectional view along line X-X' of FIG. 8. As illustrated in FIGS. 9 and 10, the insulating layer 46 is provided on the strip portion 12. The signal line SL is stacked on the insulating layer 46. An insulating layer 47 is provided to cover the signal line SL and the strip portion 12. The first gauge line 36 (gauge line 35) is provided on the insulating layer 47. An insulating layer 48 is provided to cover the first gauge line 36 (gauge line 35) and the insulating layer 47. While the material of the insulating layers 46, 47, and 48 is not particularly limited, polyimide or the like with high flexibility is preferable.

As illustrated in FIG. 9, the first gauge line 36 disposed on one side in the second direction Dy is disposed overlapping one end of the second gauge line 37. The first gauge line 36 disposed on the other side in the second direction Dy is disposed overlapping the other end of the second gauge line 37. With this configuration, the two first gauge lines 36 and the second gauge line 37 are electrically coupled.

As illustrated in FIG. 10, the signal line SL passes through the center of the strip portion 12 in the width direction. In other words, the signal line SL overlaps the imaginary center line K in plan view. The first gauge line 36 (gauge line 35) is provided at a position not overlapping the imaginary center line K. With this configuration, the amount of strain generated in the signal line SL is smaller than the amount of strain generated in the gauge line 35 when the strip portion 12 expands or contacts.

As illustrated in FIG. 8, in one strip portion 12, the length of the second gauge line 37 in the extending direction of the strip portion 12 (total length of a plurality of second gauge lines 37) is shorter than the length of the first gauge line 36 in the extending direction of the strip portion 12 (total length of a plurality of first gauge lines 36). The length of the second gauge line 37 provided to one linear portion 23 is shorter than that of the first gauge line 36 provided to one curved portion 22.

As described above, the stretchable device 1 includes the first gauge line 36 and the second gauge line 37 having a higher gauge factor than the first gauge line 36. Therefore, the stretchable device 1 can improve the detection sensitivity compared with the case where only the first gauge line 36 is used.

More specifically, the second gauge line 37 has a higher gauge factor than the first gauge line 36 and is provided to the linear portion 23 of the strip portion 12 having a small amount of strain when the stretchable device 1 is deformed. With this configuration, the stretchable device 1 can satisfactorily detect the amount of strain in the linear portion 23. The second gauge line 37 is not provided to the base 21 or the curved portion 22 of the strip portion 12 having a large amount of strain when the stretchable device 1 is deformed.

With this configuration, the stretchable device 1 uses the first gauge line 36 to detect the amount of strain in the base 21 and the curved portion 22 having a large amount of strain and uses the second gauge line 37 with a higher gauge factor to detect the amount of strain in the linear portion 23 having a small amount of strain. Therefore, the present embodiment can improve the detection sensitivity in the linear portion 23 having a small amount of strain in the strip portion 12, thereby improving the detection sensitivity in the entire strip portion 12.

The length of the second gauge line 37 is shorter than that of a plurality of first gauge lines 36. In addition, the second gauge line 37 is provided to the linear portion 23 having a small amount of strain. Therefore, the present embodiment can effectively improve the detection sensitivity while reducing the breaking of the second gauge line 37 made of semiconductor material.

As illustrated in FIG. 8, the first gauge line 36 is provided overlapping only the inner peripheral portions IA in the first curved portion 22a, the second curved portion 22b, the third curved portion 22c, and the fourth curved portion 22d. In other words, the first gauge line 36 is not provided to the outer peripheral portions OA in the first curved portion 22a, the second curved portion 22b, the third curved portion 22c, and the fourth curved portion 22d.

The second gauge line 37 has intersections 37a, 37d, and 37g extending in the width direction across the imaginary center line K in the linear portions 23.

More specifically, in the first base 21a, the first gauge line 36 is provided on the other side (left side of FIG. 8) in the first direction Dx with respect to the imaginary center line K and extends in the second direction Dy. In the first curved portion 22a, the first gauge line 36 is provided to the inner peripheral portion IA and is curved along the first curved portion 22a. In the first linear portion 23a, the intersection 37a of the second gauge line 37 extends in the width direction and couples the first gauge line 36 in the inner peripheral portion IA of the first curved portion 22a to the first gauge line 36 in the inner peripheral portion IA of the second curved portion 22b.

A coupling portion 37b coupled between the intersection 37a and the first gauge line 36 in the inner peripheral portion IA of the first curved portion 22a is curved and formed in an arc shape. A coupling portion 37c coupled between the intersection 37a and the first gauge line 36 in the inner peripheral portion IA of the second curved portion 22b is curved in an arc shape. The coupling portions 37b and 37c are formed by the second gauge line 37. This configuration can reduce the concentration of stress on the intersection 37a and the coupling portions 37b and 37c when the strip portion 12 expands or contracts, thereby reducing the breaking of the second gauge line 37.

In the second curved portion 22b, the first gauge line 36 is provided to the inner peripheral portion IA and is curved along the second curved portion 22b. In the second linear portion 23b, the intersection 37d of the second gauge line 37 extends in the width direction and couples the first gauge line 36 in the inner peripheral portion IA of the second curved portion 22b to the first gauge line 36 in the inner peripheral portion IA of the third curved portion 22c.

A coupling portion 37f coupled between the intersection 37d and the first gauge line 36 in the inner peripheral portion IA of the second curved portion 22b is formed with a bent corner. A coupling portion 37e coupled between the intersection 37d and the first gauge line 36 in the inner peripheral portion IA of the third curved portion 22c is formed with a bent corner. The coupling portions 37e and 37f are formed by the second gauge line 37. In the second linear portion 23b, the coupling portions 36e and 36f may be curved in an arc shape.

In the third curved portion 22c, the first gauge line 36 is provided to the inner peripheral portion IA and is curved along the third curved portion 22c. In the third linear portion 23c, the intersection 37g of the second gauge line 37 extends in the width direction and couples the first gauge line 36 in the inner peripheral portion IA of the third curved portion 22c to the first gauge line 36 in the inner peripheral portion IA of the fourth curved portion 22d.

In the fourth curved portion 22d, the first gauge line 36 is provided to the inner peripheral portion IA and is curved along the fourth curved portion 22d. In the second base 21b, the first gauge line 36 is provided on one side (right side of FIG. 8) in the first direction Dx with respect to the imaginary center line K and extends in the second direction Dy. The first gauge line 36 in the second base 21b is coupled to the first gauge line 36 in the inner peripheral portion IA of the fourth curved portion 22d.

With this configuration, only one of tensile stress and compressive stress is generated in the first gauge line 36 in the curved portions 22 when the strip portion 12 expands or contracts. In other words, the present embodiment prevents both tensile stress and compressive stress from being generated at a time in the first gauge line 36 in the curved portions 22. As a result, the amount of strain acting on the strip portion 12 can be accurately detected. The above has described the configuration in which the first gauge line 36 is provided only to the inner peripheral portions IA of the curved portions 22. The present embodiment is not limited thereto, and the first gauge line 36 may be provided only to the outer peripheral portions OA of the curved portions 22.

The configuration of the strip portion 12, the gauge line 35, and the signal line SL illustrated in FIGS. 8 to 10 are given by way of example only and can be appropriately changed. For example, one strip portion 12 is provided with three second gauge lines 37. The configuration is not limited thereto, and one strip portion 12 simply needs to be provided with at least one second gauge line 37. Alternatively, one strip portion 12 may be provided with two or four or more second gauge lines 37. While one strip portion 12 has four curved portions 22, it may have three or five or more curved portions 22. The configuration of the gauge line 35 (the first gauge line 36 and the second gauge line 37) can be appropriately changed corresponding to the configuration of the strip portion 12. The second gauge line 37 is provided to the entire linear portion 23. The present embodiment is not limited thereto, and the second gauge line 37 may be provided to part of the linear portion 23. In the first linear portion 23a, for example, the second gauge line 37 may be provided only to the intersection 37a extending in the width direction, and the coupling portions 37b and 37c may be formed by the first gauge line 36.

Second Embodiment

Figure 11:
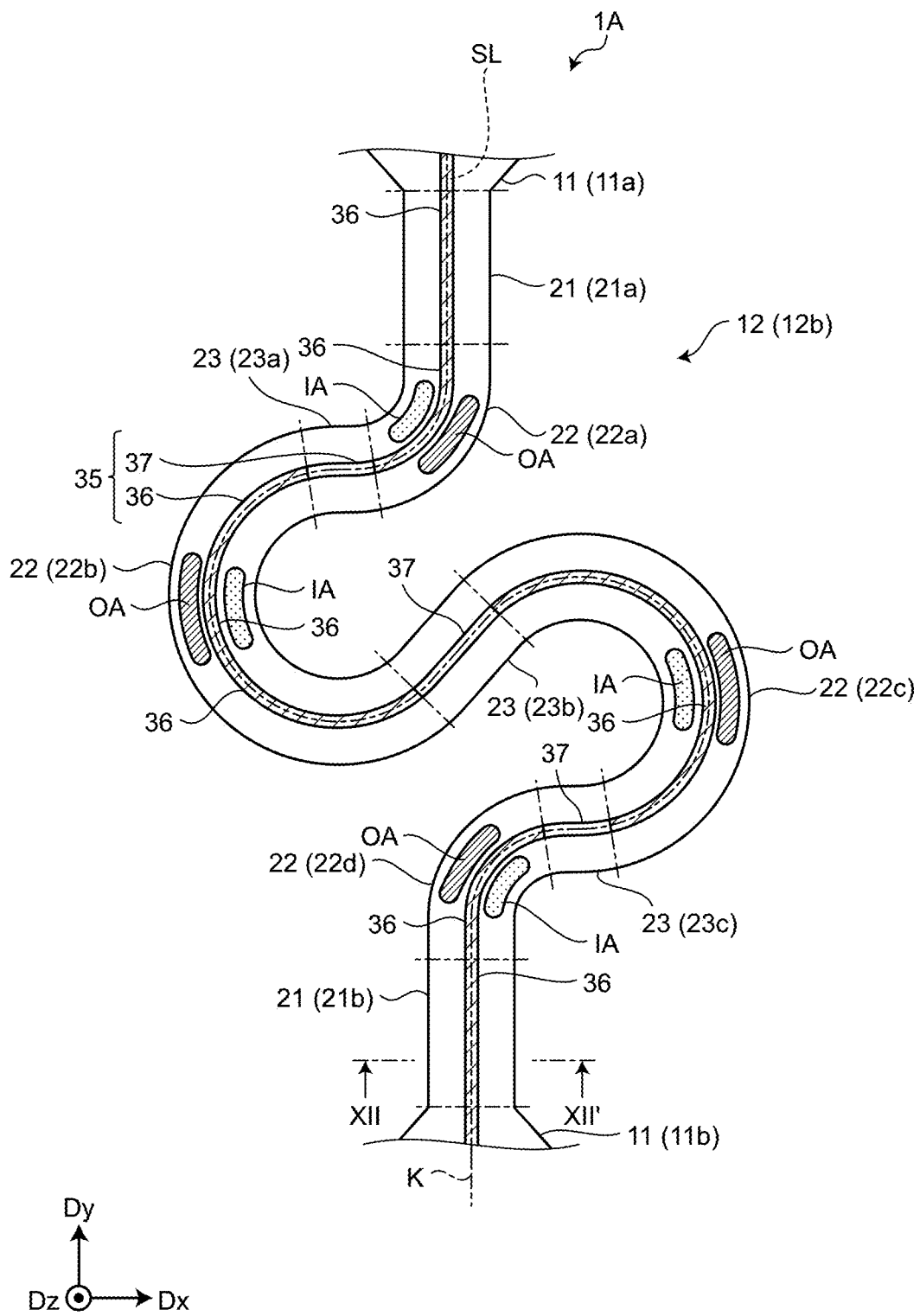
FIG. 11 is a plan view of the configuration of the resin base member, the signal line, and the gauge line of the stretchable device according to a second embodiment.
Figure 12:
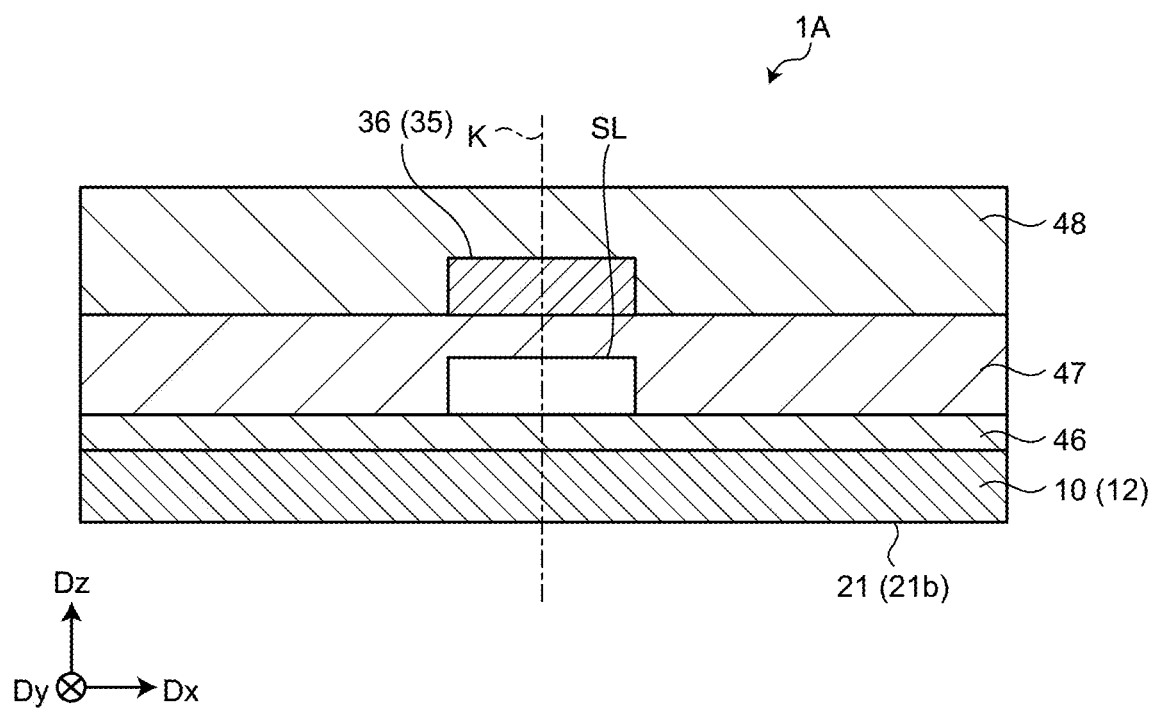
FIG. 12 is a sectional view along line XII-XII' of FIG. 11.

FIG. 11 is a plan view of the configuration of the resin base member, the signal line, and the gauge line of the stretchable device according to a second embodiment. FIG. 12 is a sectional view along line XII-XII' of FIG. 11. In the following description, the same components as those described in the embodiment above are denoted by the same reference numerals, and duplicate explanation is omitted.

As illustrated in FIGS. 11 and 12, a stretchable device 1A includes the first gauge line 36 and the second gauge line 37 having a higher gauge factor than the first gauge line 36 similarly to the first embodiment. The second gauge line 37 is provided to the linear portion 23 having a small amount of strain. With this configuration, the flexibility in the wiring of the first gauge line 36 and the second gauge line 37 can be improved.

In the stretchable device 1A according to the second embodiment, the first gauge line 36 and the second gauge line 37 extend along the extending direction of the signal line SL and are provided overlapping the signal line SL. The signal line SL, the first gauge line 36, and the second gauge line 37 are provided along the extending direction of the strip portion 12 and are disposed overlapping the center (imaginary center line K) in the width direction orthogonal to the extending direction of the strip portion 12. With this configuration, the second embodiment can reduce the width of the strip portion 12 and improve the detection sensitivity.

The present embodiment can reduce the width of the strip portion 12 because the first gauge line 36 and the second gauge line 37 do not have the intersections 36a, 36d, and 36g (refer to FIG. 8). In addition, the first gauge line 36 and the second gauge line 37 are smoothly coupled without bends or corners across the first curved portion 22a, the first linear portion 23a, the second curved portion 22b, the second linear portion 23b, the third curved portion 22c, the third linear portion 23c, and the fourth curved portion 22d. Therefore, the present embodiment can reduce unintended strain and concentration of stress.

Third Embodiment

Figure 13:
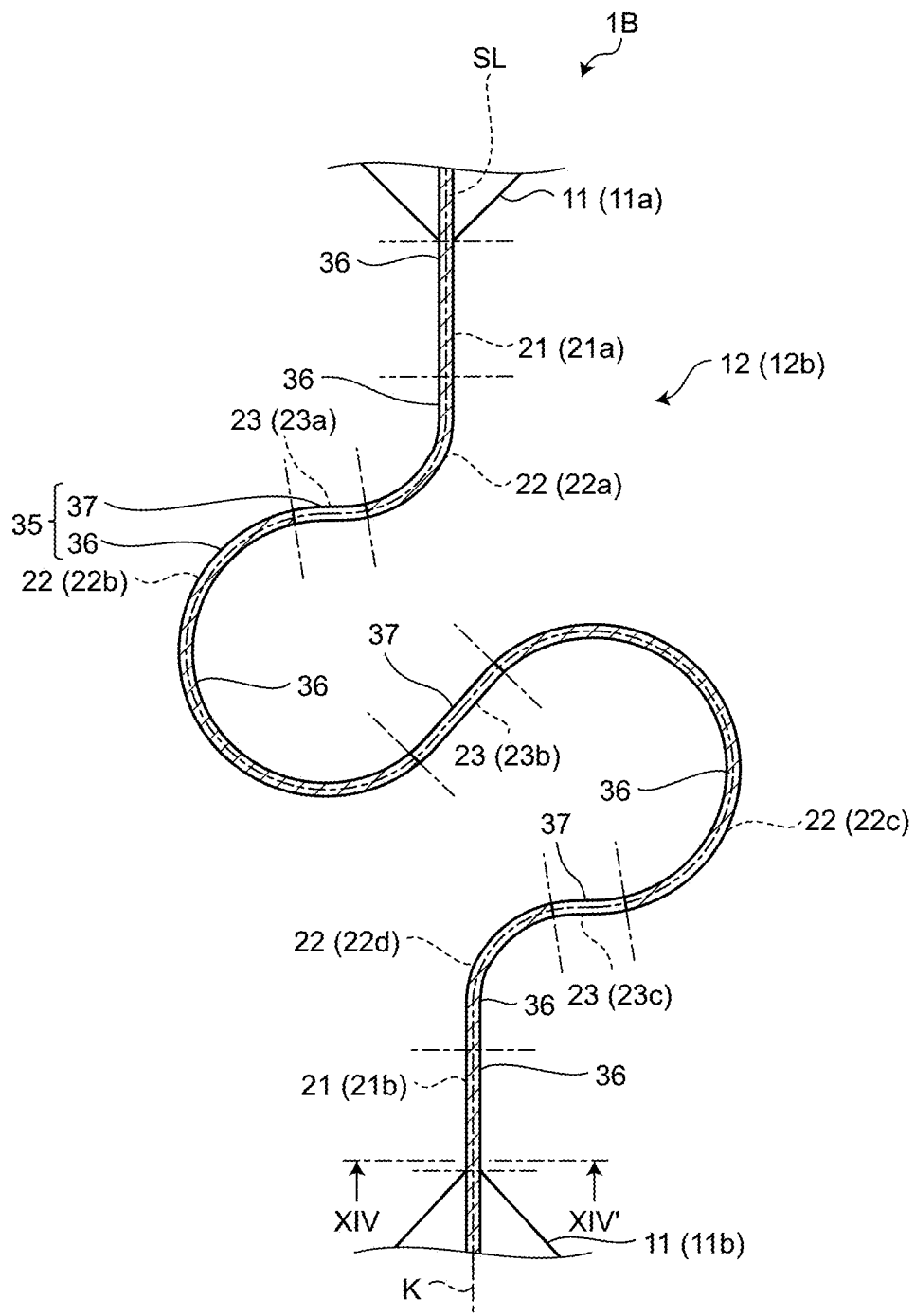
FIG. 13 is a plan view of the configuration of the resin base member, the signal line, and the gauge line of the stretchable device according to a third embodiment.
Figure 14:
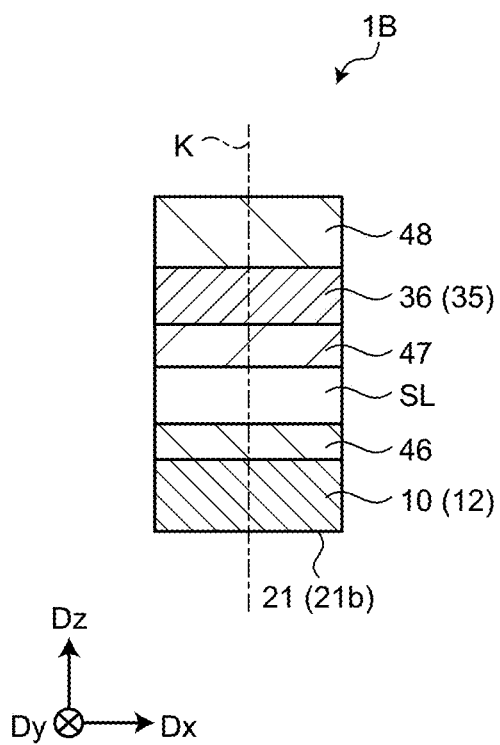
FIG. 14 is a sectional view along line XIV-XIV' of FIG. 13.

FIG. 13 is a plan view of the configuration of the resin base member, the signal line, and the gauge line of the stretchable device according to a third embodiment. FIG. 14 is a sectional view along line XIV-XIV' of FIG. 13.

As illustrated in FIGS. 13 and 14, in a stretchable device 1B according to the third embodiment, the width of the strip portion 12 is equal to that of the signal line SL, the first gauge line 36, and the second gauge line 37. With this configuration, the third embodiment can further reduce the width of the strip portion 12 compared with the second embodiment described above.

The first gauge line 36 and the second gauge line 37 have the same width as that of the signal line SL. The first gauge line 36 and the second gauge line 37, however, may have a width different from that of the signal line SL. In other words, the flexibility in the wiring of the first gauge line 36 and the second gauge line 37 can be improved because the strip portion 12 is provided with the second gauge line 37 having a higher gauge factor than the first gauge line 36. For example, the width of the first gauge line 36 and the second gauge line 37 can be made smaller than in the configuration where the strip portion 12 is composed only of the first gauge line 36. In this case, the width of the strip portion 12 is formed to be equal to that of the signal line SL and larger than that of the first gauge line 36 and the second gauge line 37.

The stretchable devices 1 and 1A according to the first and the second embodiments can also employ the configuration in which the first gauge line 36 and the second gauge line 37 have a width different from that of the signal line SL.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments and the modifications described above.

What is claimed is:

1. A stretchable device comprising:
   a resin base member comprising a plurality of island-shaped portions spaced apart from each other and a plurality of strip portions that couple the island-shaped portions; and
   a plurality of first gauge lines and at least one second gauge line having a gauge factor higher than a gauge factor of the first gauge lines, the first gauge lines and the second gauge line being provided to each of the strip portions, wherein
   the strip portion of the resin base member has a plurality of curved portions and a linear portion that couples the curved portions,
   the first gauge lines and the second gauge line each extend along an extending direction of the strip portion and are coupled along the extending direction of the strip portion,
   the first gauge lines are provided to the curved portions, and
   the second gauge line is provided to the linear portion.

2. The stretchable device according to claim 1, wherein
   the strip portion of the resin base member comprises a base coupled to the island-shaped portion and linearly extending from the island-shaped portion, and
   the first gauge line is provided to the base.

3. The stretchable device according to claim 1, wherein the length of the second gauge line provided to the linear portion is shorter than the length of the first gauge lines provided to the curved portions.

4. The stretchable device according to claim 1, wherein
   the curved portions include a first curved portion and a second curved portion,
   the linear portion is coupled between the first curved portion and the second curved portion,
   each of the first curved portion and the second curved portion is divided into an inner peripheral portion positioned on an inner peripheral side and an outer peripheral portion positioned on an outer peripheral side with respect to the center in a width direction orthogonal to the extending direction of the strip portion serving as a boundary,
   the inner peripheral portion of the first curved portion and the inner peripheral portion of the second curved portion are positioned on opposite sides with respect to the center in the width direction, and
   the first gauge line is provided overlapping one of the inner peripheral portion and the outer peripheral portion alone in the first curved portion and the second curved portion.

5. The stretchable device according to claim 4, wherein the second gauge line comprises an intersection extending in the width direction in the linear portion and coupling the first gauge line in the first curved portion to the first gauge line in the second curved portion.

6. The stretchable device according to claim 1, further comprising:
   a signal line stacked on the resin base member, wherein
   the signal line is provided along the extending direction of the strip portion and disposed overlapping the center in a width direction orthogonal to the extending direction of the strip portion, and
   the first gauge line and the second gauge line extend in an extending direction of the signal line and are provided overlapping the signal line.

7. The stretchable device according to claim 6, wherein the width of the strip portion is equal to the width of the signal line.

8. The stretchable device according to claim 1, wherein the first gauge line is made of metal material or alloy having a first gauge factor, and the second gauge line is made of semiconductor material having a second gauge factor higher than the first gauge factor.

\* \* \* \* \*